United States Patent [19]

Waggener

[11] Patent Number: 4,932,872

[45] Date of Patent: Jun. 12, 1990

[54] METHOD FOR FABRICATING X-RAY MASKS

[75] Inventor: Herbert A. Waggener, Pottersville, N.J.

[73] Assignee: Lepton Inc., Murray Hill, N.J.

[21] Appl. No.: 366,937

[22] Filed: Jun. 16, 1989

[51] Int. Cl.$^5$ ............................................. H01L 21/30
[52] U.S. Cl. ......................................... 437/225; 430/5; 156/654; 156/655; 204/192.32; 148/DIG. 135
[58] Field of Search .................. 156/654, 655, 659.1; 204/192.32; 148/DIG. 135; 430/5; 437/225

[56] References Cited

U.S. PATENT DOCUMENTS

| | | | |
|---|---|---|---|
| 4,454,209 | 6/1984 | Blair | 430/5 |
| 4,587,184 | 5/1986 | Schneider-Gmelch et al. | 156/655 |
| 4,634,643 | 1/1987 | Suzuki | 430/5 |
| 4,668,336 | 5/1987 | Shimkunas | 204/192.32 |
| 4,680,243 | 7/1987 | Shimkunas et al. | 156/655 |
| 4,719,161 | 1/1988 | Kimura et al. | 430/5 |
| 4,837,123 | 6/1989 | Kato et al. | 430/5 |

FOREIGN PATENT DOCUMENTS

| | | | |
|---|---|---|---|
| 0188918 | 10/1984 | Japan | 430/5 |
| 0102648 | 5/1986 | Japan | 430/5 |
| 0190941 | 8/1986 | Japan | 430/5 |

*Primary Examiner*—Brian E. Hearn
*Assistant Examiner*—Tuan Nguyen
*Attorney, Agent, or Firm*—Stanger, Michaelson, Reynolds, Spivak & Tobia

[57] ABSTRACT

In the disclosed method, an X-ray mask is made by forming a semiconductor wafer having a first coefficient of expansion, doping a surface of the wafer, metallizing the wafer, metallizing a washer shaped ring having a lower coefficient of expansion, bonding the ring to the doped surface at the periphery of the wafer at or above room temperature, and processing the wafer by removing the undoped substrate and depositing metallic material on the wafer.

1 Claim, 2 Drawing Sheets

METHOD FOR FABRICATING X-RAY MASKS

BACKGROUND OF THE INVENTION

This invention relates to masks for manufacturing semiconductor chips and to methods for fabricating masks used in the manufacture of semiconductor chips, and particularly to X-ray masks and their fabrication.

The current procedure for fabricating X-ray masks involves:

Growing a boron doped layer on a semiconductor substrate, bonding a glass ring to the substrate.

Etching away the substrate with an etchant that does not appreciably etch the boron doped epitaxial layer.

Metallizing the silicon side of the wafer composite.

Applying a resist, exposing the pattern, and developing.

Plating gold to a desired thickness.

Stripping the resist.

The order of these steps may vary depending upon the yield at various steps.

This technique usually includes controlling the stress in the resulting diaphragm by incorporating germanium in the epitaxial layer. This and the very high level of boron needed to insure an adequately low etch rate of the boron doped layer tends to generate defects in the silicon. They can also lead to irregularities in the thickness of the final membranes.

OBJECTS AND SUMMARY OF THE INVENTION

An object of the invention is to avoid these disadvantages.

According to a feature of the invention, the defects and stress are controlled by bonding a ring, whose coefficient of expansion is less than that of the semiconductor material of the wafer, to the boron doped layer of the wafer at a temperature above room temperature.

According to another feature of the invention, the ring has an overall zero coefficient of expansion.

According to yet another feature the material of the ring is Zerodur, a trademark in commercial use.

These and other features of the invention are pointed out in the claims. Other objects and advantages of the invention will become evident from the following detailed description of the invention when read in light of the accompanying drawings.

DETAILED DESCRIPTION OF PREFERRED EMBODIMENTS

Figure 1:
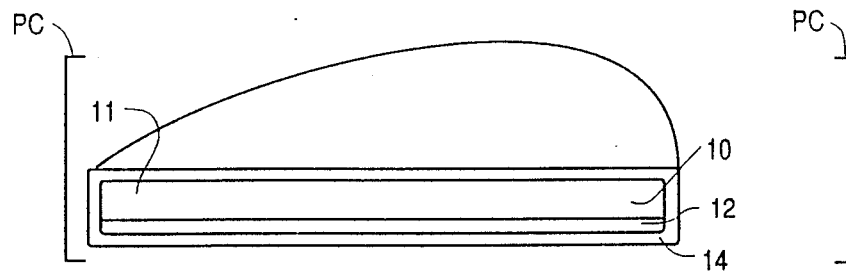
FIG. 1 is a cross-sectional view of a wafer in an intermediate condition during fabrication of a mask according to the invention.

FIG. 1 illustrates an intermediate stage in the fabrication of the mask according to the invention. Here, a standard p-type (100) silicon wafer 10 of a diameter D, contains a substrate 11 and an n-type doped region 12 formed by implanting or diffusing phosphorus in the substrate to a depth of 0.2 to 2.0 microns. The region 12 serves as an electrochemical stop during membrane formation. A metallizing Ti-Au layer 14 surrounds the entire wafer 10. The Ti thickness is about 100 to 500 Angstroms, while the Au thickness is about 100 to 10,000 Angstroms.

In FIG. 1 as well as the other figures, the wafer 10 and attached structure appears in a schematically depicted processing chamber PC.

Figure 2:
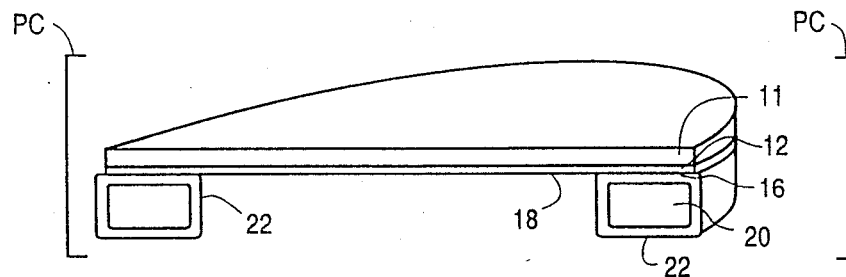
FIG. 2 is a cross-sectional view of a wafer in an intermediate condition during fabrication of a mask according to the invention.

FIG. 2 illustrates another intermediate stage in the fabrication of the mask according to the invention. Here, a suitable material 16 bonds the lower surface 18 of the region 12 in the wafer 10 to a flat polished Zerodur washer or ring 20. A Ti-Au metallizing layer 22 corresponding to the layer 14 also surrounds the ring 20.

Figure 3:
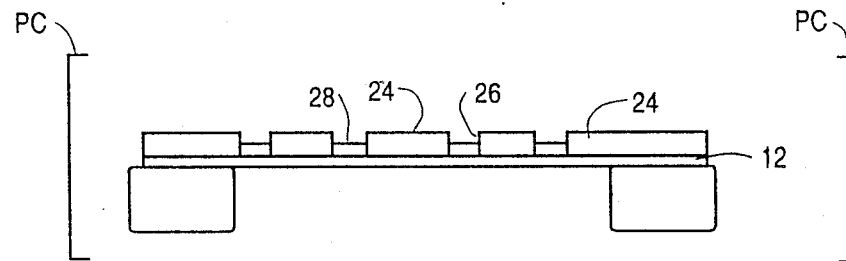
FIG. 3 is a cross-sectional view of a wafer in an intermediate condition during fabrication of a mask according to the invention.

FIG. 3 shows another intermediate stage in the fabrication of the mask. Here, an etch has removed the substrate 11 and a resist 24 covers the remaining region 12. The resist 24 has been exposed to an E beam pattern and developed to form paths 26. Au material 28 plated on the resist 24 fills the paths 26.

Figure 4:
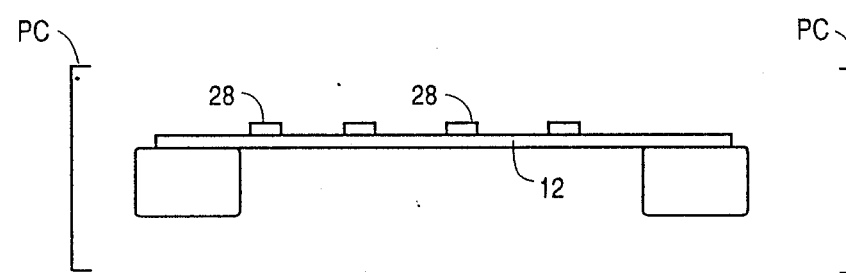
FIG. 4 is a cross-sectional view of a mask embodying features of the invention.
Figure 5:
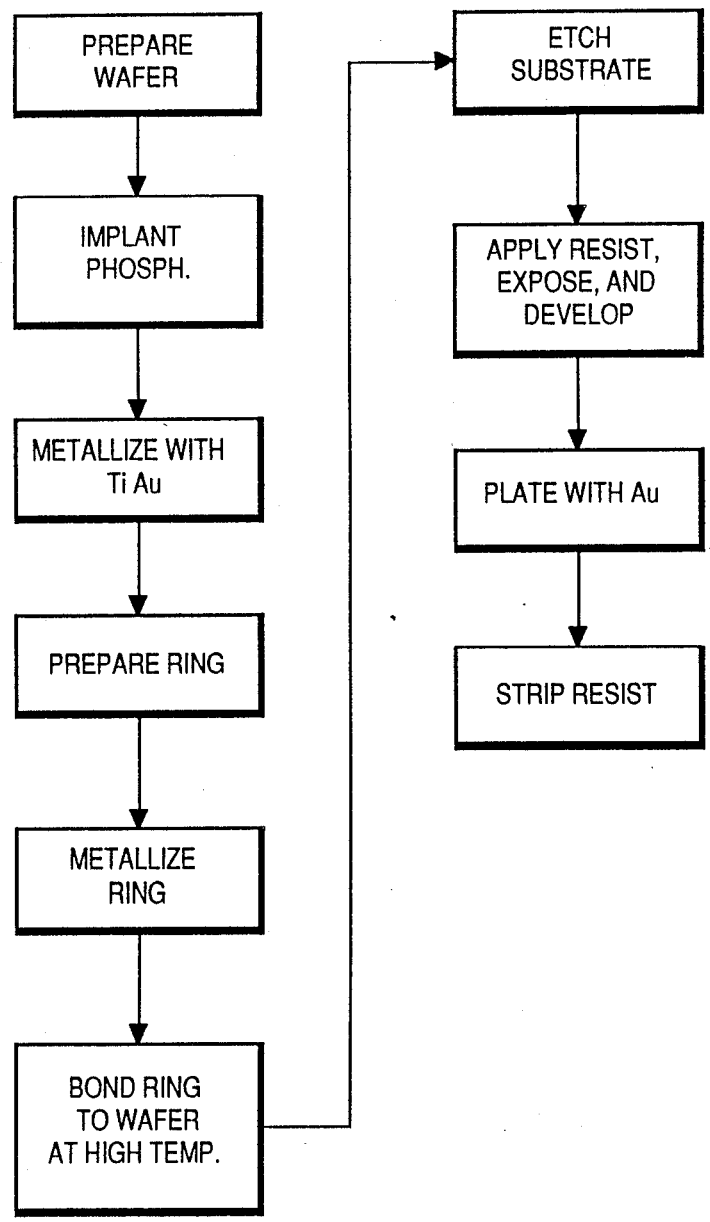
FIG. 5 is a flow diagram illustrating the fabricating steps according to the invention.

FIG. 4 depicts the final mask 30 showing the resist 24 stripped away and exposing Au material 28 plated on the layer 14 to form the mask 30, The steps of fabricating the mask 30 appear in the flow diagram of FIG. 5 and include the following sequence.

1. Prepare a standard P-type 8 to 10 own percent of meter (100) silicon wafer 10 having a diameter d.

2. Implant or diffuse phosphorus into the wafer 10 to a range of junction depths of 0.2 to 2 microns. The region 12 serves as an electrochemical stop during eventual membrane formation.

3. Metallize the wafer with a Ti-Au coating so that the thickness of the Ti is approximately 100 to 500 Angstroms and that of the Au 100 to 10,000 Angstroms.

4. Prepare a Zerodur washer or ring having a flat and polished surface with an inner diameter sufficient to expose the required membrane and with an outer diameter somewhat larger than the diameter d. The required thickness control and flatness is similar to standard silicon wafer technology.

5. Metallize the Zerodur ring with a Ti-Au in step 3, namely with a thickness of Ti approximately 100 to 500 Angstroms and a thickness of Au about 100 to 10,000 Angstroms. To form the layer 22 if it is desirable to use electrostatic chucking, the metal would cover both sides.

6. Bond the metallized surface of the region 12 of the layer 10 to the metallized washer using a suitable material at elevated temperature. Maintain the temperature of bonding so that when the bonded structure is returned to room temperature, the difference in expansion coefficient including residual stresses (if any) results in the silicon wafer 10 being in tension. When the p-types silicon substrate is removed, the residual tension in the membrane is determined by its bonding temperature. Since the ring is Zerodur the effective expansion coefficient is essentially zero.

7. Immerse the bonded composite in an alkaline etching cell which protects the n+ region 12 from the liquid. In this step, place a positive potential on the silicon (n+) to enable stopping. The procedure is carried out in the processing cell by maintaining the pressure equalized on both sides to prevent diaphragm rupture.

8. Remove the silicon substrate 11.

9. Apply the resist 24 and expose to a pattern using a source of energy such as E beams and develop.

10. Plate Au to the desired thickness.

11. Strip the resist.

While embodiments of the invention have been described in detail, it will be evident that the invention may be embodied otherwise.

What is claimed is:

1. The method of making an X-ray mask, comprising:

forming a wafer of a semiconductor material having a first temperature coefficient of expansion and having a periphery;

doping a surface of said wafer to a predetermined depth so as to form a doped region and a substrate;

metallizing the wafer;

metallizing a washer shaped ring having a second temperature coefficient of expansion less than the first temperature coefficient of expansion of said wafer material;

bonding the ring to the doped surface of the wafer along the periphery of said wafer at a temperature above room temperature;

processing the wafer, said processing including removing the substrate from the wafer and depositing metallic material on the wafer.

* * * * *